United States Patent
Mochida et al.

(10) Patent No.: US 9,478,283 B2
(45) Date of Patent: Oct. 25, 2016

(54) NONVOLATILE SEMICONDUCTOR STORAGE DEVICE HAVING IMPROVED READING AND WRITING SPEED CHARACTERISTICS

(71) Applicant: PANASONIC INTELLECTUAL PROPERTY MANAGEMENT CO., LTD., Osaka (JP)

(72) Inventors: Reiji Mochida, Osaka (JP); Kazuyuki Kouno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/439,227

(22) PCT Filed: Nov. 19, 2013

(86) PCT No.: PCT/JP2013/006785
§ 371 (c)(1),
(2) Date: Apr. 28, 2015

(87) PCT Pub. No.: WO2014/080616
PCT Pub. Date: May 30, 2014

(65) Prior Publication Data
US 2015/0279457 A1    Oct. 1, 2015

(30) Foreign Application Priority Data

Nov. 20, 2012    (JP) ................. 2012-253933

(51) Int. Cl.
*G11C 11/00*    (2006.01)
*G11C 13/00*    (2006.01)
(Continued)

(52) U.S. Cl.
CPC .............. *G11C 13/004* (2013.01); *G11C 8/14* (2013.01); *G11C 11/1653* (2013.01);
(Continued)

(58) Field of Classification Search
CPC .......... G11C 13/0069; G11C 13/0004; G11C 13/0007
USPC ......................... 365/148, 158, 163
See application file for complete search history.

(56) References Cited

U.S. PATENT DOCUMENTS

| 8,139,395 B2* | 3/2012 | Kotaki | G11C 7/02 365/148 |
| 8,542,519 B2* | 9/2013 | Asao | H01L 29/82 257/295 |

(Continued)

FOREIGN PATENT DOCUMENTS

| JP | 2005-216387 A | 8/2005 |
| JP | 2006-303150 A | 11/2006 |

(Continued)

OTHER PUBLICATIONS

International Search Report issued in International Application No. PCT/JP2013/006785 with Date of mailing Dec. 24, 2013, with English Translation.

*Primary Examiner* — Connie Yoha
(74) *Attorney, Agent, or Firm* — McDermott Will & Emery LLP

(57) ABSTRACT

A nonvolatile semiconductor memory device includes: a memory cell (MC0) including a cell transistor (TC0) and a variable resistance element (RR0); a memory cell (MC1) including a cell transistor (TC1) and a variable resistance element (RR1); a word line (WL0) connected to the cell transistor (TC0); a word line (WL1) connected to the cell transistor (TC1); a data line (SL0) connecting the cell transistor (TC0) and the variable resistance element (RR1) to each other; and a data line (BL0) connecting the variable resistance element (RR0) and the cell transistor (TC1) to each other.

14 Claims, 10 Drawing Sheets

(51) Int. Cl.
  *G11C 11/22* (2006.01)
  *H01L 45/00* (2006.01)
  *H01L 27/22* (2006.01)
  *H01L 27/24* (2006.01)
  *G11C 8/14* (2006.01)
  *G11C 11/16* (2006.01)

(52) U.S. Cl.
  CPC ...... *G11C 11/1655* (2013.01); *G11C 11/1657* (2013.01); *G11C 11/1659* (2013.01); *G11C 11/1673* (2013.01); *G11C 11/1675* (2013.01); *G11C 11/22* (2013.01); *G11C 11/2253* (2013.01); *G11C 11/2255* (2013.01); *G11C 11/2257* (2013.01); *G11C 11/2259* (2013.01); *G11C 11/2273* (2013.01); *G11C 11/2275* (2013.01); *G11C 13/0002* (2013.01); *G11C 13/003* (2013.01); *G11C 13/0004* (2013.01); *G11C 13/0007* (2013.01); *G11C 13/0023* (2013.01); *G11C 13/0026* (2013.01); *G11C 13/0028* (2013.01); *G11C 13/0069* (2013.01); *G11C 13/0097* (2013.01); *H01L 27/228* (2013.01); *H01L 27/2436* (2013.01); *H01L 45/06* (2013.01); *H01L 45/1233* (2013.01); *G11C 2013/005* (2013.01); *G11C 2013/009* (2013.01); *G11C 2013/0071* (2013.01); *G11C 2213/79* (2013.01); *G11C 2213/82* (2013.01)

(56) References Cited

U.S. PATENT DOCUMENTS

| 8,681,538 | B2* | 3/2014 | Inaba | G11C 11/1659 365/130 |
|---|---|---|---|---|
| 2005/0174854 | A1 | 8/2005 | Tsushima et al. | |
| 2008/0049487 | A1 | 2/2008 | Yoshimura et al. | |
| 2009/0296446 | A1 | 12/2009 | Asao | |

FOREIGN PATENT DOCUMENTS

| JP | 2008-052781 A | 3/2008 |
|---|---|---|
| JP | 2008-065953 A | 3/2008 |

* cited by examiner

FIG.6

| | READOUT | RESET (PROGRAM) | SET (ERASE) |
|---|---|---|---|
| WL | Vg_read | Vg_reset | Vg_set |
| BL | Vread | Vreset | VSS |
| SL | VSS | VSS | Vset |
| OPERATION | "0"/"1" READOUT | TO HIGH RESISTANCE (DATA "0") | TO LOW RESISTANCE (DATA "1") |

※n, o, p, AND q ARE INTEGERS GREATER THAN OR EQUAL TO 0

※n, o, p, AND q ARE INTEGERS GREATER THAN OR EQUAL TO 0

NONVOLATILE SEMICONDUCTOR STORAGE DEVICE HAVING IMPROVED READING AND WRITING SPEED CHARACTERISTICS

RELATED APPLICATIONS

This application is a national phase of International Application No. PCT/JP2013/006785, filed on Nov. 19, 2013, which in turn claims the benefit of Japanese Application No. 2012-253933, filed on Nov. 20, 2012, the disclosures of which Applications are incorporated by reference herein.

TECHNICAL FIELD

The present invention relates to nonvolatile semiconductor memory devices, and particularly to a technique for improving basic characteristics of memories and increasing the speed of reading and writing data.

BACKGROUND ART

With recent increase in demands for electronic equipment, especially cell phones (including smartphones), portable music players, digital cameras, and tablet terminals, for example, a demand for nonvolatile semiconductor memory devices has increased, and techniques for achieving higher capacity, smaller size, higher speeds in writing and reading, and operation at lower power consumption have been actively developed.

Flash memories are currently the mainstream of nonvolatile memories, but rewriting in a flash memory takes time on the order of microseconds or milliseconds. Thus, improvement in performance of set equipment including the flash memory is inhibited.

In recent years, new nonvolatile memories that enable rewriting at higher speed with lower power consumption than flash memories have been actively developed. Examples of such new nonvolatile memories include resistive random access memories (ReRAMs) using variable resistance elements for memory devices. The resistive random access memory enables high-speed rewriting on the order of nanoseconds. In addition, the resistive random access memory requires only about 1.8 V for rewriting although a flash memory requires 10 V or higher. Thus, power consumption of nonvolatile memories can be reduced.

Patent Document 1 describes a configuration of a readout circuit of a resistive random access memory. Memory cells of the resistive random access memory are constituted by serially connected variable resistance elements and cell transistors. A variable resistance element stores data by setting the resistance of the variable resistance element at a high level or a low level in the range from 1 KΩ to 1 MΩ, for example, depending on stored data (data "0" or data "1"). Specifically, by utilizing a phenomenon in which the amount of memory cell current is large when the resistance of the variable resistance element is low, and is small when the resistance of the variable resistance element is high, the difference between these memory cell currents is detected by a sense amplifier circuit in a readout operation, thereby reading data stored in a memory cell.

A memory cell array in which memory cells described above are arranged in columns and rows includes a plurality of bit lines connected in common to variable resistance elements included in memory cells associated with the columns and also includes a plurality of source lines connected in common to source terminals of cell transistors included in the memory cells associated with the rows. In reading data, one of the bit lines or the source lines are input to the sense amplifier circuit and the other are grounded so that the bit lines and the source lines are charged. In this manner, the difference between the memory cell current values of the memory cell can be detected by the sense amplifier circuit, thereby enabling reading of data stored in the memory cells.

Patent Document 2 describes a configuration of a write circuit for a resistive random access memory. A memory cell of the resistive random access memory is constituted by a variable resistance element and a cell transistor that are serially connected. The variable resistance element can be set in a high resistance state or a low resistance state depending on the direction of a write voltage. Specifically, the memory cell can be set in a high resistance state by applying a write voltage to a variable resistance element side of the memory cell and grounding a cell transistor side of the memory cell. On the other hand, the memory cell can be set in a low resistance state by grounding the variable resistance element side of the memory cell and applying a write voltage to the cell transistor side of the memory cell.

CITATION LIST

Patent Document

Patent Document 1: Japanese Unexamined Patent Publication No. 2008-065953
Patent Document 1: Japanese Unexamined Patent Publication No. 2008-052781

SUMMARY OF THE INVENTION

Technical Problem

The conventional variable resistance nonvolatile memories described above, however, have the following problems. Specifically, since the bit lines are connected in common to the variable resistance elements of the memory cells, the bit lines need to be disposed in a layer above the variable resistance elements. Thus, although wiring resistance of the bit lines is low in general, the parasitic capacitance load is large. On the other hand, since the source lines are connected in common to the cell transistors of the memory cells, the source lines need to be disposed in a layer below the bit lines. Thus, wiring resistance is generally high, and a parasitic capacitance load is small. Accordingly, in writing data, a write voltage (Vreset) is applied to the bit lines in order to set the variable resistance elements in a high resistance state, and a write voltage (Vset) is applied to the source lines in order to set the variable resistance elements in a low resistance state. However, even with application of these predetermined write voltages, different voltages are applied to both terminals of the memory cell because of the difference in resistance load between the bit lines and the source lines. Consequently, the nonvolatile memory might degrade its basic characteristics such as a rewriting time characteristic and a data retention characteristic after rewriting. The bit lines need to be charged in reading or writing data, but this charging cannot be performed at high speed because of a large capacity load of the bit lines.

It is therefore an object of the present invention to provide a nonvolatile semiconductor memory device with improved basic memory characteristics and increased speed in reading and writing data.

Solution to the Problem

To achieve the above-described object, the present invention provides the following device. A nonvolatile semiconductor memory device includes: a plurality of memory cells including at least a first memory cell including a first cell transistor and a first variable resistance element having a terminal connected to a drain terminal of the first cell transistor, and a second memory cell including a second cell transistor and a second variable resistance element having a terminal connected to a drain terminal of the second cell transistor; a plurality of word lines associated with the plurality of memory cells and including a first word line connected to a gate terminal of the first cell transistor, and a second word line connected to a gate terminal of the second cell transistor; a first data line connecting a source terminal of the first cell transistor to another terminal of the second variable resistance element; and a second data line connecting another terminal of the first variable resistance element to a source terminal of the second cell transistor.

Alternatively, a nonvolatile semiconductor memory device may include: a plurality of memory cells arranged in rows and columns and each including a cell transistor and a variable resistance element connected to a drain terminal of the cell transistor; a plurality of word lines corresponding to the rows of the plurality of memory cells and connected in common to gate terminals of the cell transistors included in the corresponding memory cells; a plurality of first data lines corresponding to the columns or rows of the plurality of memory cells and connected in common to the variable resistance elements included in the corresponding memory cells; a plurality of second data lines corresponding to the columns or rows of the plurality of memory cells and connected in common to source terminals of the cell transistors included in the corresponding memory cells; a first memory cell array region including at least one of the plurality of word lines; and a second memory cell array region including at least one of the plurality of word lines different from the word line included in the first memory cell array region, wherein the plurality of first data lines in the first memory cell array region are connected to the plurality of second data lines in the second memory cell array region, and the plurality of second data lines in the first memory cell array region are connected to the plurality of first data lines in the second memory cell array region.

Alternatively, a nonvolatile semiconductor memory device may include: a plurality of memory cells arranged in rows and columns and each including a cell transistor and a variable resistance element connected to a drain terminal of the cell transistor; a plurality of word lines corresponding to the rows of the plurality of memory cells and connected in common to gate terminals of cell transistors included in the corresponding memory cells; a plurality of first data lines corresponding to the columns or rows of the plurality of memory cells and connected in common to the variable resistance elements included in the corresponding memory cells; a plurality of second data lines corresponding to the columns or rows of the plurality of memory cells and connected in common to source terminals of the cell transistors included in the corresponding memory cells; a first memory cell array region including at least one of the plurality of word lines; and a second memory cell array region including at least one of the plurality of word lines different from the word line included in the first memory cell array region, wherein at least one pair of first and second data lines of the plurality of first and second data lines in the first memory cell array region are connected to at least one pair of first and second data lines of the plurality of first and second data lines in the second memory cell array region, and at least one pair of first and second data lines of the other first and second data lines in the first memory cell array region are connected to at least one pair of second and first data lines of the other first and second data lines in the second memory cell array region.

In the nonvolatile semiconductor memory device, to set the variable resistance element in a high resistance state in writing data in the memory cell, a write voltage is applied to the first data line and the second data line is grounded. On the other hand, to set the variable resistance element in a low resistance state, the first data line is grounded and a write voltage is applied to the second data line.

In a conventional technique, a wiring resistance load of the second data line is larger than that of the first data line, and the amount of voltage drop differs between the first and second data lines. Thus, even with application of the same write voltage to the first and second data lines, the same write voltage is not applied to both terminals of the memory cell. For example, with application of a drain voltage Vset (e.g., 2.4 V) for setting the variable resistance element in a low resistance state, the voltage drop at a terminal of the memory array is 300 mV, whereas with application of a drain voltage Vreset (e.g., 2.4 V) for setting the variable resistance element in a high resistance state, the voltage drop at a terminal of the memory array is 60 mV. Accordingly, the voltage balance is disturbed between the case of setting the variable resistance element in a high resistance state and the case of setting the variable resistance element in a low resistance state. As a result, as the number of rewriting operations increases, the data retention characteristic after rewriting deteriorates.

On the other hand, in the nonvolatile semiconductor memory device of the present invention, the loads of the first and second data lines can be made uniform. Accordingly, when the same write voltage is applied to the first data line and the second data line, the same voltage is applied to both terminals of the memory cell. For example, with application of a drain voltage Vset (e.g., 2.4 V) for setting the variable resistance element in a low resistance state, the voltage drop at a terminal of the memory array is 180 mV, whereas with application of a drain voltage Vreset (e.g., 2.4 V) for setting the variable resistance element in a high resistance state, the voltage drop at a terminal of the memory array is 180 mV. Thus, the voltage is well balanced between the case of setting the variable resistance element in a high resistance state and the case of setting the variable resistance element in a low resistance state. As a result, basic characteristics such as a rewriting time characteristic and a data retention characteristic after rewriting can be improved.

In reading data, the first data line connected to the variable resistance element included in the memory cell is charged, and current is caused to flow by grounding the second data line connected to the source terminal of the cell transistor so that data stored in the memory cell is determined by the sense amplifier.

In a conventional technique, since the capacity loads of the first data lines and the via are large, the first data line cannot be charged at high speed.

On the other hand, in the nonvolatile semiconductor memory device of the present invention, the capacity load can be made uniform between the first data line and the second data line. Thus, the capacity load of the first data line and the via can be reduced to substantially a half. Accordingly, the first data line can be charged at high speed.

In writing data, a reset (program) operation is expected to have similar advantages as those in data reading.

The difference in capacity load between the first data line and the second data line becomes more and more significant as the memory capacity increases. Thus, the present invention is more effective for nonvolatile semiconductor memory devices in which memory capacities tend to increase.

Advantages of the Invention

In a nonvolatile semiconductor memory device according to the present invention, the capacity load can be made uniform between the first and second data lines. Thus, basic memory characteristics of a memory can be improved, and data can be read out and written at high speed.

BRIEF DESCRIPTION OF THE DRAWINGS

FIG. 6 shows a relationship between operation modes and voltages applied to a memory cell in the nonvolatile semiconductor memory device of the embodiment.

DESCRIPTION OF EMBODIMENTS

Figure 1:
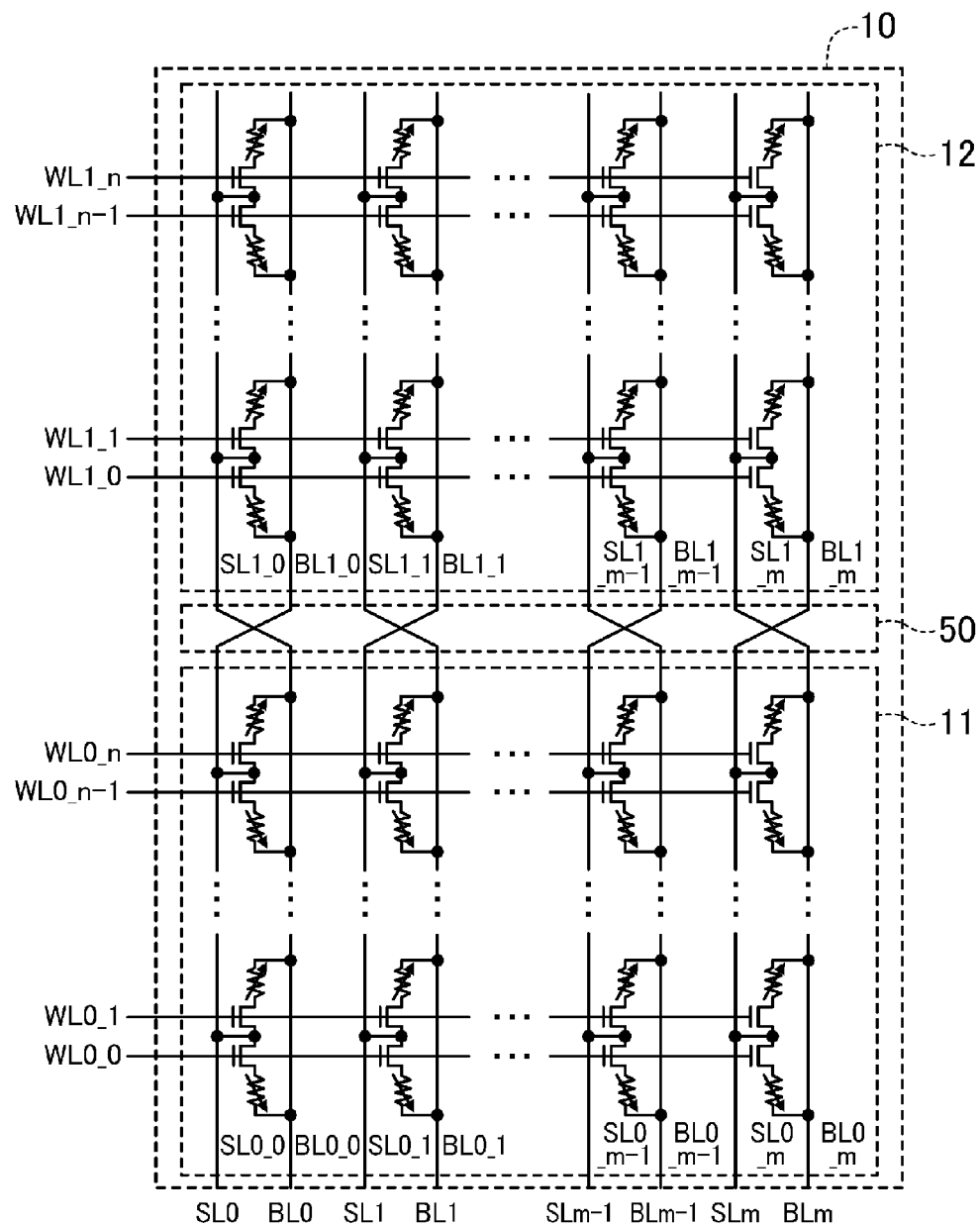
FIG. 1 illustrates a configuration of a memory array as a main portion of a nonvolatile semiconductor memory device according to an embodiment of the present invention.

An embodiment of the present invention will be described hereinafter with reference to the drawings. Like reference characters designate identical or corresponding components in drawings, and description of components designated by like reference characters may not be repeated.

FIG. 1 illustrates a detailed configuration of a memory array as a main portion of a nonvolatile semiconductor memory device according to an embodiment of the present invention, and shows connection of data lines, which is a feature of the invention.

Figure 2:
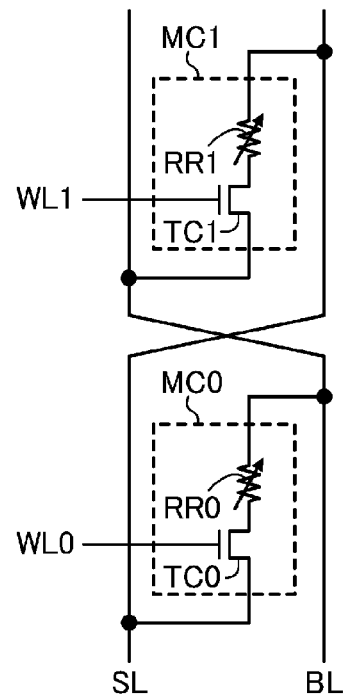
FIG. 2 illustrates a configuration of a minimum unit of the memory array illustrated in FIG. 1.

FIG. 2 illustrates a configuration of a minimum unit of the memory array illustrated in FIG. 1. FIGS. 1 and 2 will be referred to after description of the entire configuration of the nonvolatile semiconductor memory device of the embodiment.

Figure 3:
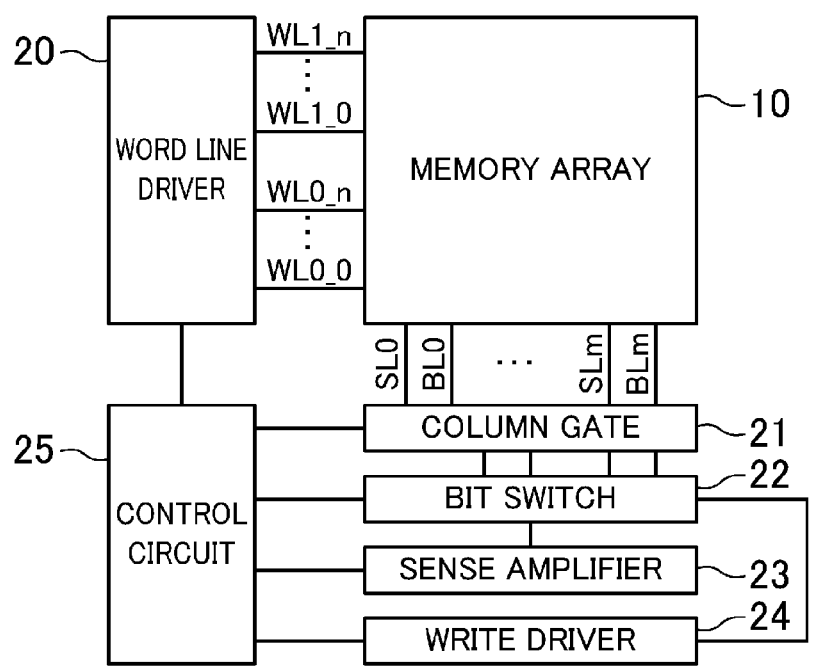
FIG. 3 illustrates the entire configuration of the nonvolatile semiconductor memory device of the embodiment.

FIG. 3 illustrates the entire configuration of the nonvolatile semiconductor memory device of this embodiment. The nonvolatile semiconductor memory device includes a memory array 10, a word line driver 20, a column gate 21, a bit switch 22, a sense amplifier 23, a write driver 24, and a control circuit 25.

In the memory array 10, a plurality of memory cells for storing data are disposed. The memory array 10 are connected to word lines WL0_0 to WL0_n and WL1_0 to WL1_n (which may be collectively referred to as WL), bit lines BL0 to BLm (which may be collectively referred to as BL), and source lines SL0 to SLm (which may be collectively referred to as SL). The word lines, the bit lines, and the source lines are associated with the individual memory cells. The memory array 10 will be described in detail later. Each of m and n is an integer greater than or equal to 0 (zero).

The word line driver 20 is a circuit that receives an input address (not shown in FIG. 3) and selects and drives one of the word lines WL connected to the memory array 10.

The column gate 21 is a circuit that receives an input address (not shown in FIG. 3), selects one of the bit lines BL connected to the memory array 10 and one of the source lines SL connected to the memory array 10, and connects the selected bit and source lines to the bit switch 22.

The bit switch 22 is a circuit that receives an input address (not shown in FIG. 3), connects one of the bit line BL or the source line SL selected by the column gate 21 to the sense amplifier 23 and the write driver 24, which will be described later, and connects the other to a ground voltage VSS.

The sense amplifier 23 is a circuit that reads data stored in the memory cell of the memory array 10 and determines the data in a readout operation. The readout operation is performed by selecting the bit lines BL0 to BLn connected to the memory cells through the column gate 21 and the bit switch 22 and connecting the selected bit lines BL0 to BLn to the sense amplifier 23. In this embodiment, a reference current flowing in the sense amplifier 23 has an optional value. The present invention is also applicable to a case where the reference current is generated by using the memory cells or a fixed resistor.

The write driver 24 is a circuit that applies a rewrite voltage to the memory array 10 in a rewrite operation of data. Specifically, to perform the data rewrite operation on the memory cells, either the bit lines BL or the source lines SL are selected, and a positive voltage is applied to the selected bit lines BL or source lines SL. To perform no rewrite operation, a ground voltage VSS is applied to the selected bit lines BL or source lines SL. The voltage supplied from the write driver 24 is applied to the bit lines BL or the source lines SL selected through the column gate 21 and the bit switch 22.

The control circuit 25 is a circuit that controls operation modes such as the readout operation and the rewrite operation of the nonvolatile semiconductor memory device, and controls the word line driver 20, the column gate 21, the bit switch 22, the sense amplifier 23, and the write driver 24 described above.

Figure 4:
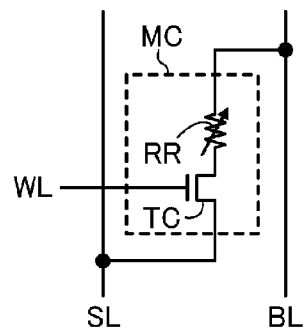
FIG. 4 is an example configuration of a memory cell included in the memory array illustrated in FIG. 1.

FIG. 4 is a circuit diagram of a memory cell included in the memory array of this embodiment. In this embodiment, the nonvolatile semiconductor memory device is constituted by using resistive random access memories (ReRAMs), for example. A memory cell MC is constituted by a variable resistance element RR and a cell transistor TC that are connected to each other in series. The word line WL is connected to a gate terminal of the cell transistor TC, the bit line BL is connected to a terminal of the variable resistance element RR, and the source line SL is connected to a source terminal of the cell transistor. In the example of this embodiment, the bit line BL is connected to the variable resistance element RR, and the source line SL is connected to the cell transistor TC. The present invention is also applicable to a memory cell in which the bit line BL is connected to the cell transistor TC and the source line SL is connected to the variable resistance element RR. The memory cell of the nonvolatile semiconductor memory device of this embodiment is a variable resistance memory cell of a 1T1R type constituted by one cell transistor TC and one variable resistance element RR.

Figure 5:
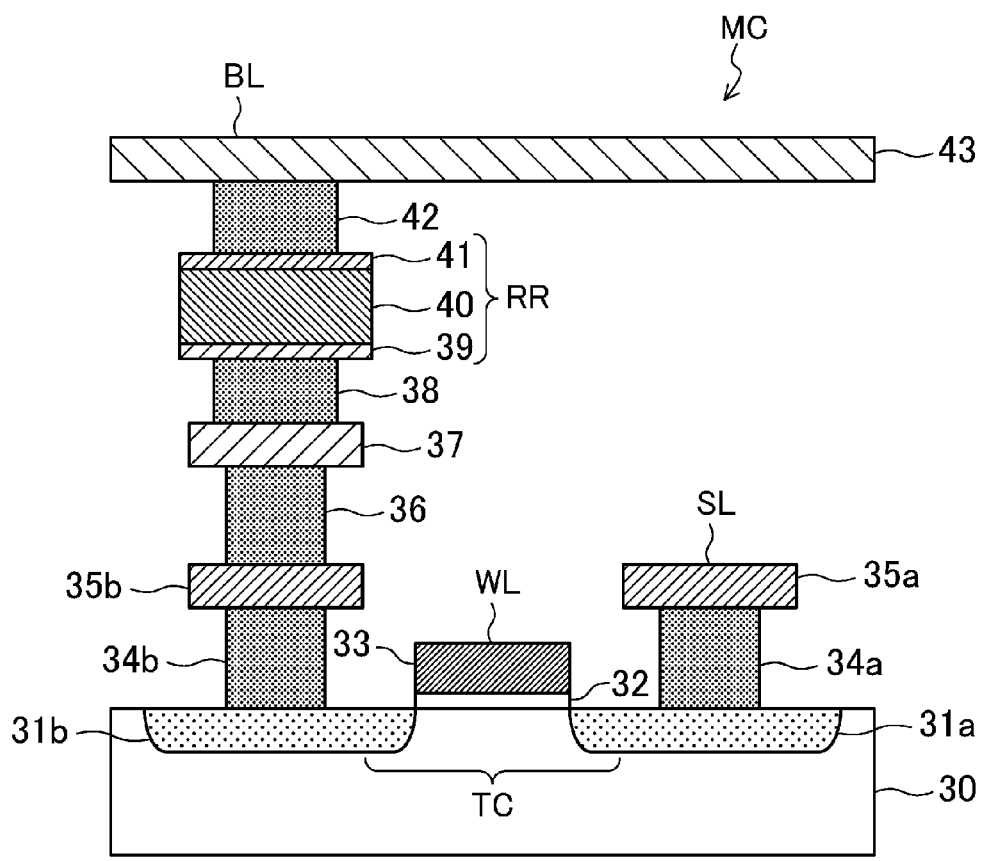
FIG. 5 is a cross sectional view of the memory cell illustrated in FIG. 4.

FIG. 5 is a cross sectional view of the memory cell illustrated in FIG. 4. Diffusion regions 31a and 31b are defined in upper portions of the semiconductor substrate 30. The diffusion region 31a serves as a source terminal of the cell transistor TC, and the diffusion region 31b serves as a drain terminal of the cell transistor TC. A region between the diffusion regions 31a and 31b serves as a channel region of the cell transistor TC. An oxide film 32 and a gate electrode 33 (a word line WL) of polysilicon are stacked on the channel region, and serve as the cell transistor TC.

The source terminal 31a of the cell transistor TC is connected to the source line SL that is a first interconnect layer 35a through a via 34a. The drain terminal 31b of the cell transistor TC is connected to a first interconnect layer 35b through a via 34b. The first interconnect layer 35b is connected to the second interconnect layer 37 through a via 36. The second interconnect layer 37 is connected to the variable resistance element RR through a via 38. The variable resistance element RR includes a lower electrode 39, a variable resistance layer 40, and an upper electrode 41. The variable resistance element RR is connected to the bit line BL that is a third interconnect layer 43 through a via 42.

FIG. 6 shows a relationship between operation modes and voltages applied to a memory cell in the nonvolatile semiconductor memory device of this embodiment.

In FIG. 6, in a data readout operation, a gate voltage Vg_read (e.g., 1.8 V) is applied to the word line WL so that the cell transistor TC is selected, a drain voltage Vread (e.g., 0.4 V) is applied to the bit line BL, and a ground voltage VSS (0 V) is applied to the source line SL. In this manner, the amount of a memory cell current is small when the variable resistance element RR is in a high resistance state (in a reset or program state), whereas the amount of the memory cell current is large when the variable resistance element RR is in a low resistance state (a set or erase state). Thus, data stored in the memory cell MC can be identified by determining the difference in current value with the sense amplifier 23.

In a reset operation (a program operation), a gate voltage Vg_reset (e.g., 2.4 V) is applied to the word line WL so that the cell transistor TC is selected, a drain voltage Vreset (e.g., 2.4 V) is applied to the bit line BL, and a ground voltage VSS (0 V) is applied to the source line SL. In this manner, a positive voltage is applied to the upper electrode 41 of the variable resistance element RR, and the variable resistance element RR changes to a high resistance state (data "0").

In a set operation (an erase operation), a gate voltage Vg_set (e.g., 2.4 V) is applied to the word line WL so that the cell transistor TC is selected, a ground voltage VSS (0 V) is applied to the bit line BL, and a source voltage Vset (e.g., 2.4 V) is applied to the source line SL. In this manner, a positive voltage is applied to the lower electrode 39 of the variable resistance element RR, and the variable resistance element RR changes to a low resistance state (data "1").

Referring to FIG. 1, the memory array 10 includes memory cell arrays 11 and 12 in each of which the memory cells MC illustrated in FIG. 4 are arranged in rows and columns to form a matrix pattern and an intersection region 50 that will be described later.

The memory cell array 11, which is a first memory cell array region, includes word lines WL0_0 to WL0_n, bit lines BL0_0 to BL0_m, which are first data lines, and source lines SL0_0 to SL0_m, which are second data lines. The word lines WL are connected to gate terminals of cell transistors, the bit lines BL are connected to terminals at one side of each variable resistance element, and the source lines SL are connected to source terminals of the cell transistors. That is, the memory cell array 11 is constituted by (n+1)×(m+1) memory cells.

The memory cell array 12, which is a second memory cell array region, includes word lines WL1_0 to WL1_n, bit lines BL1_0 to BL1_m, which are first data lines, and source lines SL1_0 to SL1_m, which are second data lines. As described above, the word lines WL are connected to gate terminals of the cell transistors, the bit lines BL are connected to terminals at one side of each variable resistance element, and the source lines SL are connected to source terminals of the cell transistors. That is, the memory cell array 12 is constituted by (n+1)×(m+1) memory cells.

The source lines SL0_0 to SL0_m and the source lines SL1_0 to SL1_m may be first data lines with the bit line BL0_0 to BL0_m and the bit lines BL1_0 to BL1_m serving as second data lines.

The intersection region 50 is a region where the bit lines BL0_0 to BL0_m of the memory cell array 11 are connected to the source lines SL1_0 to SL1_m of the memory cell array 12, and the source lines SL0_0 to SL0_m of the memory cell array 11 are connected to the bit lines BL1_0 to BL1_m of the memory cell array 12. That is, in the intersection region 50, the bit lines BL of the memory cell array 11 and the source lines SL of the memory cell array 12 are connected so as to cross the source lines SL of the memory cell array 11 and the bit lines BL of the memory cell array 12 which are connected to each other. This state of connection will be referred to as a cross connection (cross-connected).

The configuration illustrated in FIG. 2 will now be described. As illustrated in FIG. 2, a first memory cell MC0 is formed by connecting one terminal of a first variable resistance element RR0 and a drain terminal of a first cell transistor TC0 in series, and the first word line WL0 is connected to a gate terminal of the cell transistor TC0. A second memory cell MC1 is formed by connecting one terminal of a second variable resistance element RR1 and a drain terminal of a second cell transistor TC1 in series, and the second word line WL1 is connected to a gate terminal of the cell transistor TC1. The bit line BL is connected to the other terminal of the variable resistance element RR0 and a source terminal of the cell transistor TC1. The source lines SL is connected to a source terminal of the cell transistor TC0 and the other terminal of the variable resistance element RR1.

A mode in which data is read out from a selected memory cell will be described.

Figure 7:
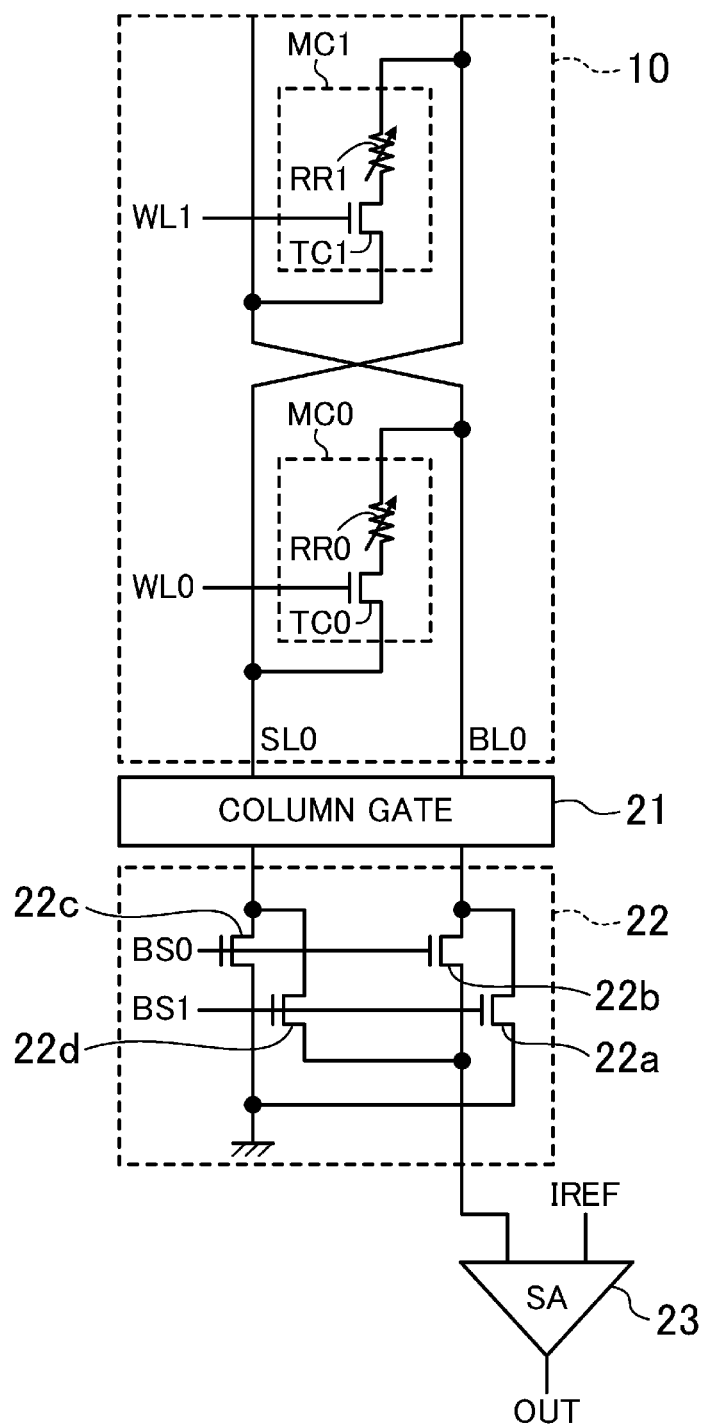
FIG. 7 illustrates an example of a selected memory cell in a readout operation of the nonvolatile semiconductor memory device of the embodiment.

FIG. 7 illustrates an example of a selected memory cell in a readout operation of the nonvolatile semiconductor memory device of this embodiment. The bit switch 22 includes first through fourth switching transistors 22a to 22d. The first switching transistor 22a has a gate terminal connected to a bit switch line BS1 and switches connection between the bit line BL0 and the ground voltage VSS between on and off. The second switching transistor 22b has a gate terminal connected to a bit switch line BS0 and switches connection between the bit line BL0 and the sense amplifier 23 between on and off. The third switching transistor 22c has a gate terminal connected to the bit switch line BS0 and switches connection between the source lines SL0 and the ground voltage VSS between on and off. The fourth switching transistor 22d has a gate terminal connected to a bit switch line BS1 and switches connection between the source lines SL0 and the sense amplifier 23 between on and off.

Referring to FIG. 7, the case of selecting the memory cell MC0 connected to the word line WL0, the bit line BL0, and the source line SL0 in the memory array 10 will be described. In this case, the selection of the bit switch line BS0 activates the switching transistors 22b and 22c, connects the bit line BL0 to the sense amplifier 23, and connects the source lines SL0 to the ground voltage VSS.

Referring to FIG. 7, the case of selecting the memory cell MC1 connected to the word line WL1, the bit line BL0, and the source line SL0 in the memory array 10 will be described. In this case, the selection of the bit switch line BS1 activates the switching transistors 22a and 22d, connects the source line SL0 to the sense amplifier 23, and connects the bit line BL0 to the ground voltage VSS.

In the readout operation, the bit switch line and the word line WL are selected, and a drain voltage (e.g., 0.4 V) is applied to the bit line BL or the source lines SL connected to the sense amplifier 23 so that a memory cell current in an amount according to the resistance value of the variable resistance element flows in the memory cell. When the amount of the memory cell current is smaller than a reference current IREF, i.e., the resistance of the variable resistance element is high, the sense amplifier 23 outputs data "0". On the other hand, when the amount of the memory cell current is larger than the reference current, i.e., the resistance of the variable resistance element is low, the sense amplifier 23 outputs data "1". In this manner, the readout operation is performed.

Figure 8:
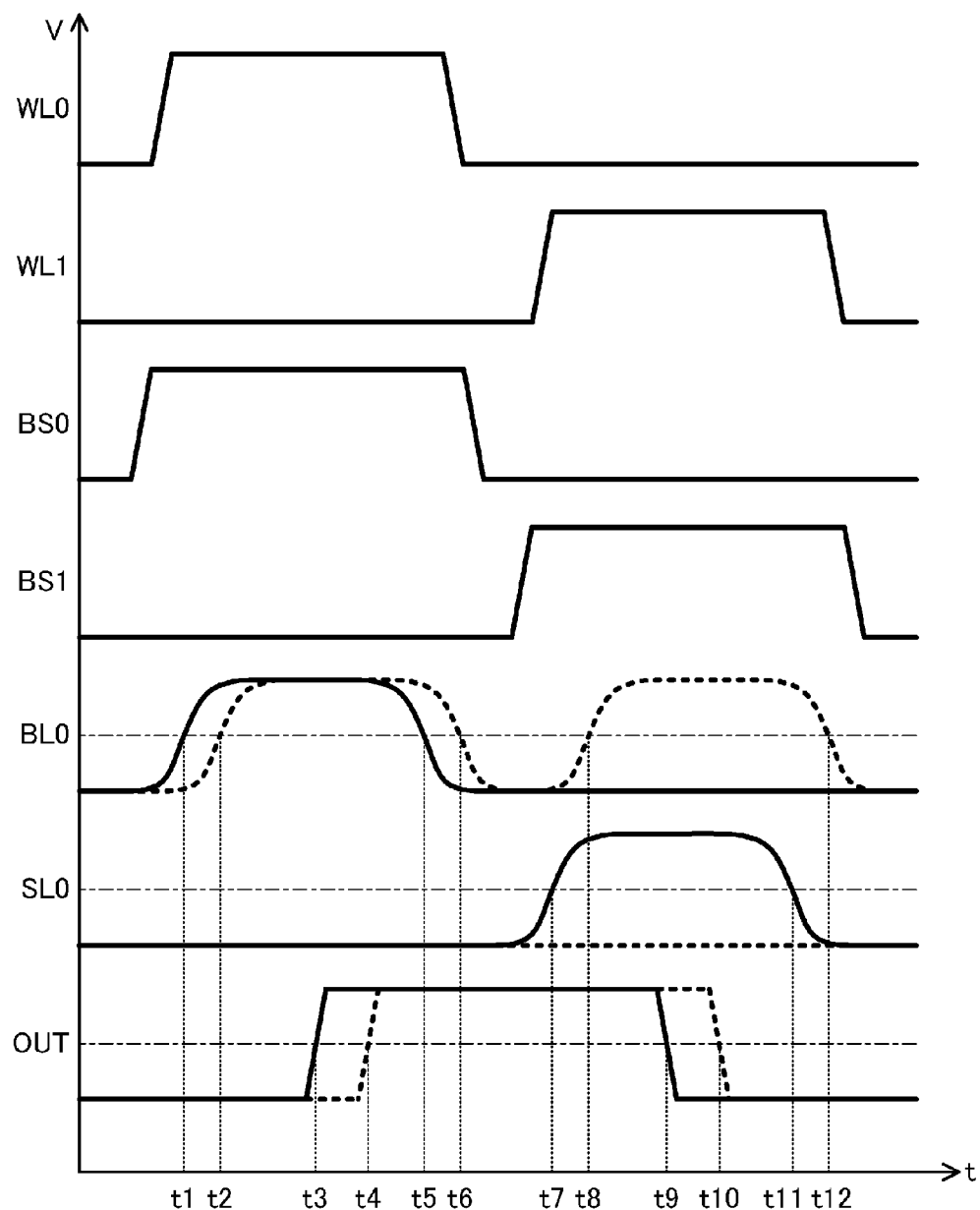
FIG. 8 is an operation waveform diagram showing a readout operation of the nonvolatile semiconductor memory device of the embodiment.

FIG. 8 is an operation waveform diagram showing a readout operation of the nonvolatile semiconductor memory device of this embodiment. In FIG. 8, the ordinate represents voltage, and the abscissa represents time. The operation waveform diagram of FIG. 8 shows a case in which data "1" is stored in the memory cell MC0 in FIG. 7 and data "0" is stored in the memory cell MC1 in FIG. 7. In a case where the memory cell MC0 is selected in FIG. 7, the bit switch line BS0 and the word line WL0 are selected and a drain voltage is applied to the bit line BL0, thereby causing a memory cell current in accordance with the resistance state of the variable resistance element RR0 to flow. Since the variable resistance element RR0 is in the low resistance state, the sense amplifier 23 determines the readout data as data "1" and outputs data "1" to an output terminal OUT.

In the case of selecting the memory cell MC1, the bit switch line BS1 and the word line WL1 are selected and a drain voltage is applied to the source line SL0, thereby causing a memory cell current in accordance with the resistance state of the variable resistance element RR1 to flow. Since the variable resistance element RR1 is in the high resistance state, the sense amplifier 23 determines the readout data as data "0" and outputs data "0" to the output terminal OUT.

In FIG. 8, broken lines for the bit line BL0, the source line SL0, and the output terminal OUT are operation waveforms of a conventional technique. The rising time of the bit line BL0 is t2 and the rising time of the output terminal OUT is t4 in the conventional technique, whereas the rising time of the bit line BL0 is t1 and the rising time of the output terminal OUT is t3 in this embodiment. This demonstrates that the speed of the readout operation is increased in this embodiment.

A mode in which data is stored in a selected memory cell will now be described.

Figure 9:
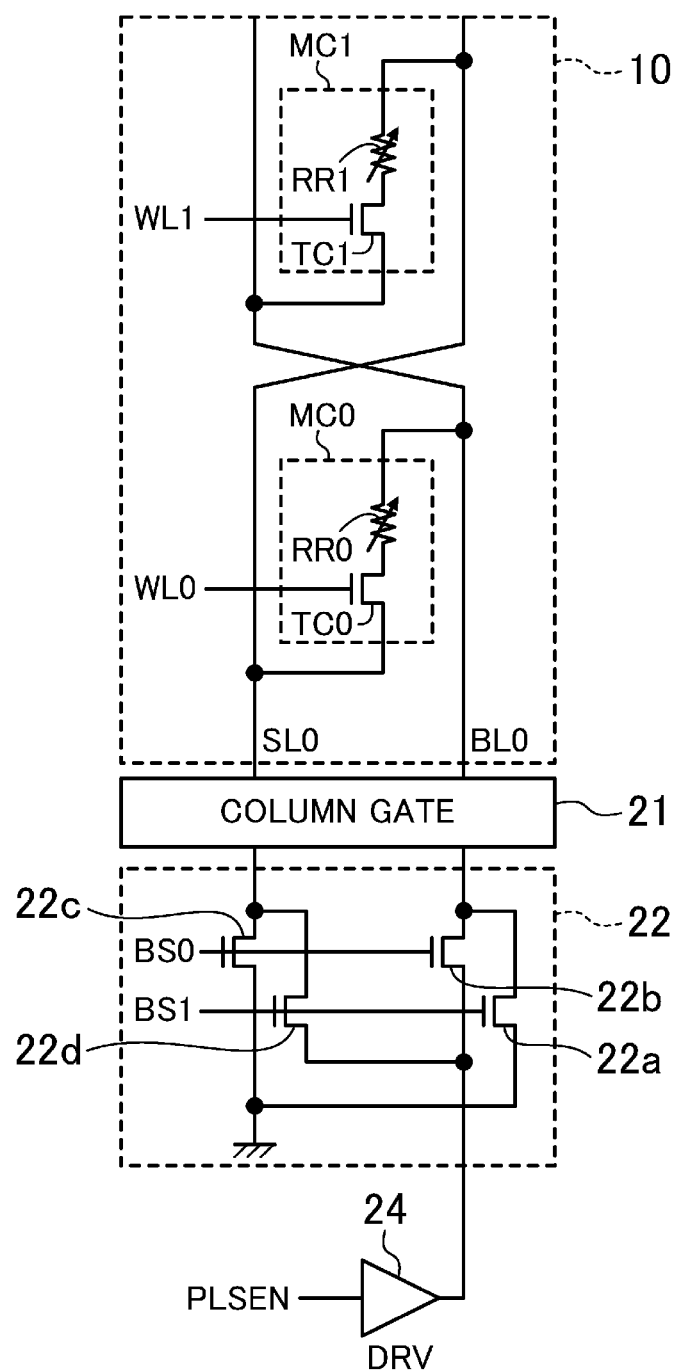
FIG. 9 illustrates an example of a selected memory cell in a write operation of the nonvolatile semiconductor memory device of the embodiment.

FIG. 9 illustrates an example of a selected memory cell in a write operation of the nonvolatile semiconductor memory device of this embodiment.

In the bit switch 22 illustrated in FIG. 9, the first switching transistor 22a has a gate terminal connected to the bit switch line BS1 and switches connection between the bit line BL0 and the ground voltage VSS between on and off. The second switching transistor 22b has a gate terminal connected to the bit switch line BS0 and switches connection between the bit line BL0 and the write driver 24 between on and off. The third switching transistor 22c has a gate terminal connected to the bit switch line BS0 and switches connection between the source line SL0 and the ground voltage VSS between on and off. The fourth switching transistor 22d has a gate terminal connected to the bit switch line BS1 and switches connection between the source line SL0 and the write driver 24 between on and off.

Referring to FIG. 9, the case of selecting the memory cell MC0 connected to the word line WL0, the bit line BL0, and the source line SL0 in the memory array 10 will be described. In FIG. 9, in the case of performing a reset (program) operation, the selection of the bit switch line BS0 activates the switching transistors 22b and 22c, connects the bit line BL0 to the write driver 24, and connects the source line SL0 to the ground voltage VSS. In the case of performing a set (erase) operation, the selection of the bit switch line BS1 activates the switching transistors 22a and 22d, connects the source line SL0 to the write driver 24, and connects the bit line BL0 to the ground voltage VSS.

Referring to FIG. 9, the case of selecting the memory cell MC1 connected to the word line WL1, the bit line BL0, and the source line SL0 in the memory array 10 will be described. In the case of performing a reset (program) operation, the selection of the bit switch line BS1 activates the switching transistors 22a and 22d, connects the source line SL0 to the write driver 24, and connects the bit line BL0 to the ground voltage VSS. In the case of performing a set (erase) operation, the selection of the bit switch line BS0 activates the switching transistors 22b and 22c, connects the bit line BL0 to the write driver 24, and connects the source line SL0 to the ground voltage VSS.

In the write operation, the bit switch line and the word line WL are selected, and a drain voltage (e.g., 2.4 V) is applied to the bit line BL or the source lines SL connected to the write driver 24 so that the variable resistance element changes to a high resistance state (data "0") or a low resistance state (data "1"). When a positive voltage is applied to an upper electrode of the variable resistance element, the variable resistance element changes to the high resistance state (data "0"). When a positive voltage is applied to a lower electrode of the variable resistance element, the variable resistance element changes to the low resistance state (data "1").

Figure 10:
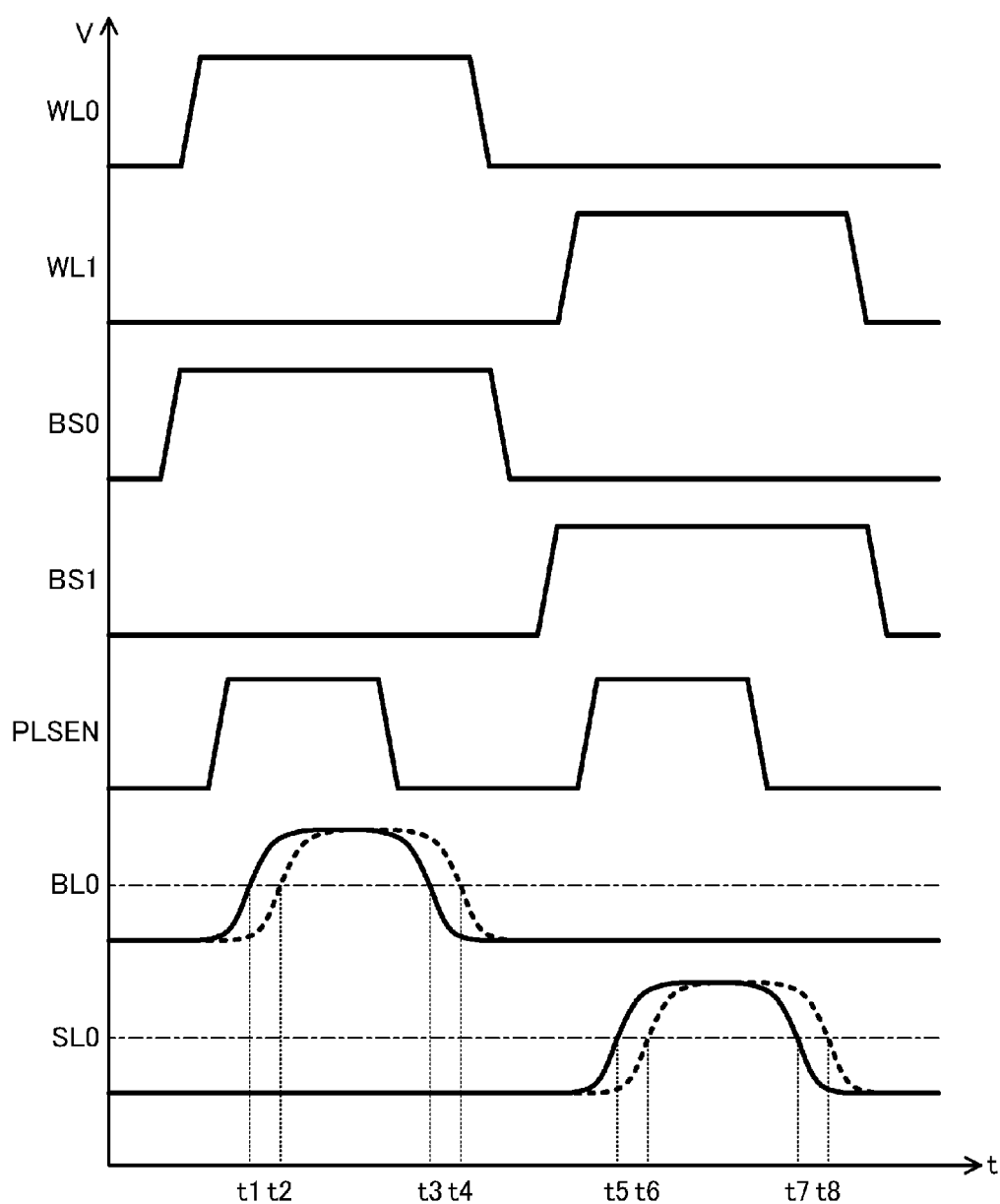
FIG. 10 is an operation waveform diagram showing a write operation of the nonvolatile semiconductor memory device of the embodiment.

FIG. 10 is an operation waveform diagram showing a write operation of the nonvolatile semiconductor memory device of this embodiment. In FIG. 10, the ordinate represents voltage, and the abscissa represents time. In the case of performing a reset (program) operation on the memory cell MC0 illustrated in FIG. 9, the bit switch line BS0 and the word line WL0 are selected and a drain voltage Vreset is applied to the bit line BL0 so that a positive voltage is applied to an upper electrode of the variable resistance element RR0 and the variable resistance element RR0 changes to the high resistance state (data "0").

In the case of performing a reset (program) operation on the memory cell MC1, the bit switch line BS1 and the word line WL1 are selected and a drain voltage Vreset is applied to the bit line BL0 so that a positive voltage is applied to an upper electrode of the variable resistance element RR1 and the variable resistance element RR1 changes to the high resistance state (data "0").

In FIG. 10, broken lines for the bit line BL0 and the source line SL0 are operation waveforms of a conventional technique. The rising time of the bit line BL0 is t2 and the rising time of the source line SL0 is t6 in the conventional technique, whereas the rising time of the bit line BL0 is t1 and the rising time of the source line SL0 is t5 in this embodiment. This demonstrates that the speed of the write operation is increased in this embodiment. In FIGS. 9 and 10, PLSEN represents a clock signal showing the timing of applying a voltage to the bit line BL or the source line SL.

As described above, in the nonvolatile semiconductor memory device of this embodiment, the speed of reading and writing data can be increased.

In this embodiment, one first memory cell array region, one second memory cell array region, and one intersection region are provided. Alternatively, a plurality of first memory cell array regions, a plurality of second memory cell array regions, and a plurality of intersection regions may be provided. This case will be described below.

Figure 11:
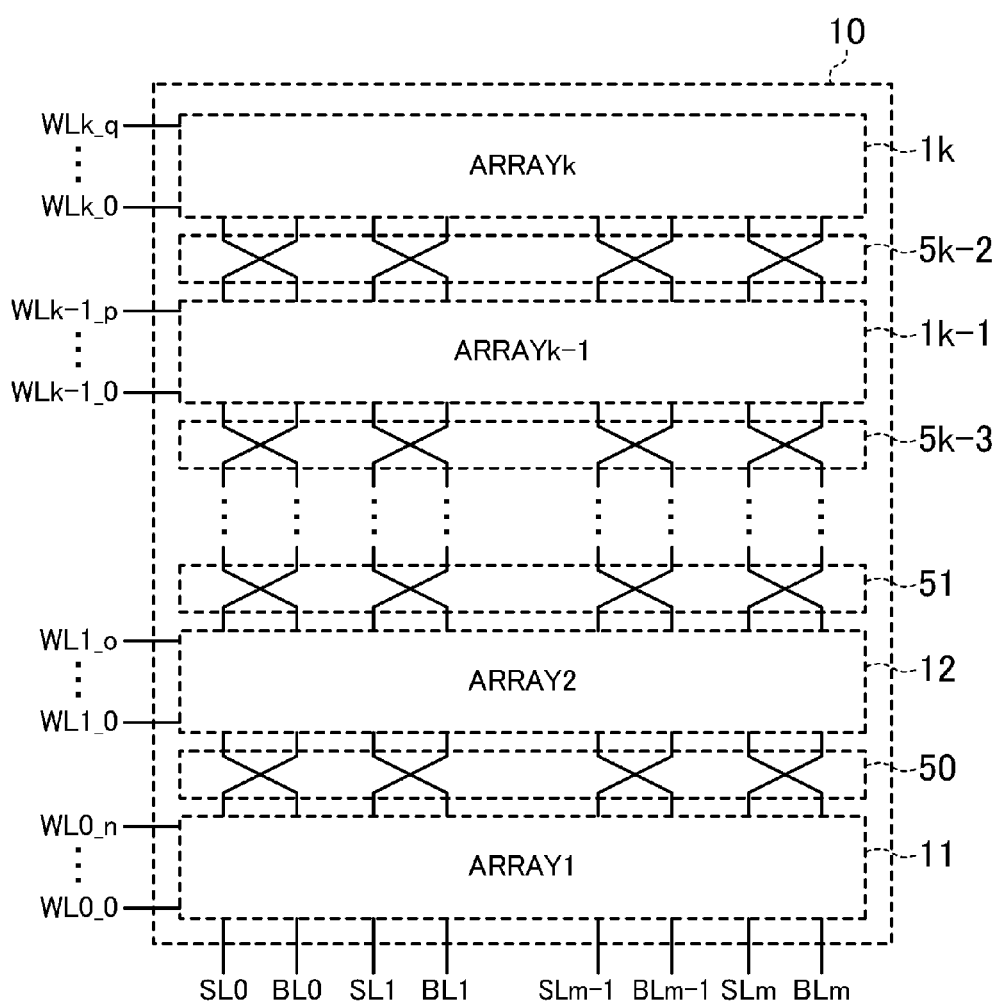
FIG. 11 illustrates another example configuration of the memory array illustrated in FIG. 1.

FIG. 11 illustrates another example configuration of the memory array illustrated in FIG. 1. As illustrated in FIG. 11, the memory array 10 may include a plurality of memory cell arrays 11-1k (ARRAY1 to ARRAYk) and a plurality of intersection regions 50 to 5k-2. Here, k is an integer greater than or equal to two. For example, if k is 4, ARRAY1 and ARRAY3 correspond to first memory cell array regions, and ARRAY2 and ARRAY4 correspond to second memory cell array regions in FIG. 11. Intersection regions 50, 51, and 52 are provided between ARRAY1 and ARRAY2, between ARRAY2 and ARRAY3, and between ARRAY3 and ARRAY4, respectively.

The numbers (the values of n, o, p, and q) of word lines WL0_0 to WL0_n, WL1_0 to WL1_o, WLk−1_0 to WLk−1_p, and WLk_0 to WLk_q connected to the memory cell arrays 11-1k may not be the same. Here, n, o, p, and q are integers greater than or equal to 0 (zero). The memory cell arrays 11-1k are constituted for smaller numbers of word lines WL and the intersection regions 50 to 5k-2 are disposed therebetween so that the loads of the bit lines BL0 to BLm and the source lines SL0 to SLm can be made more uniform. As a result, the advantages described above can be further enhanced.

In the intersection regions 50 to 5k-2, the bit lines BL and the source lines SL do not need to be cross-connected to each other, and it is sufficient that at least a pair of the bit line BL and the source line SL are cross-connected to each other. The pair of the bit line BL and the source line SL cross-connected to each other may differ among the intersection regions 50 to 5k-2. This case will be described below.

Figure 12:
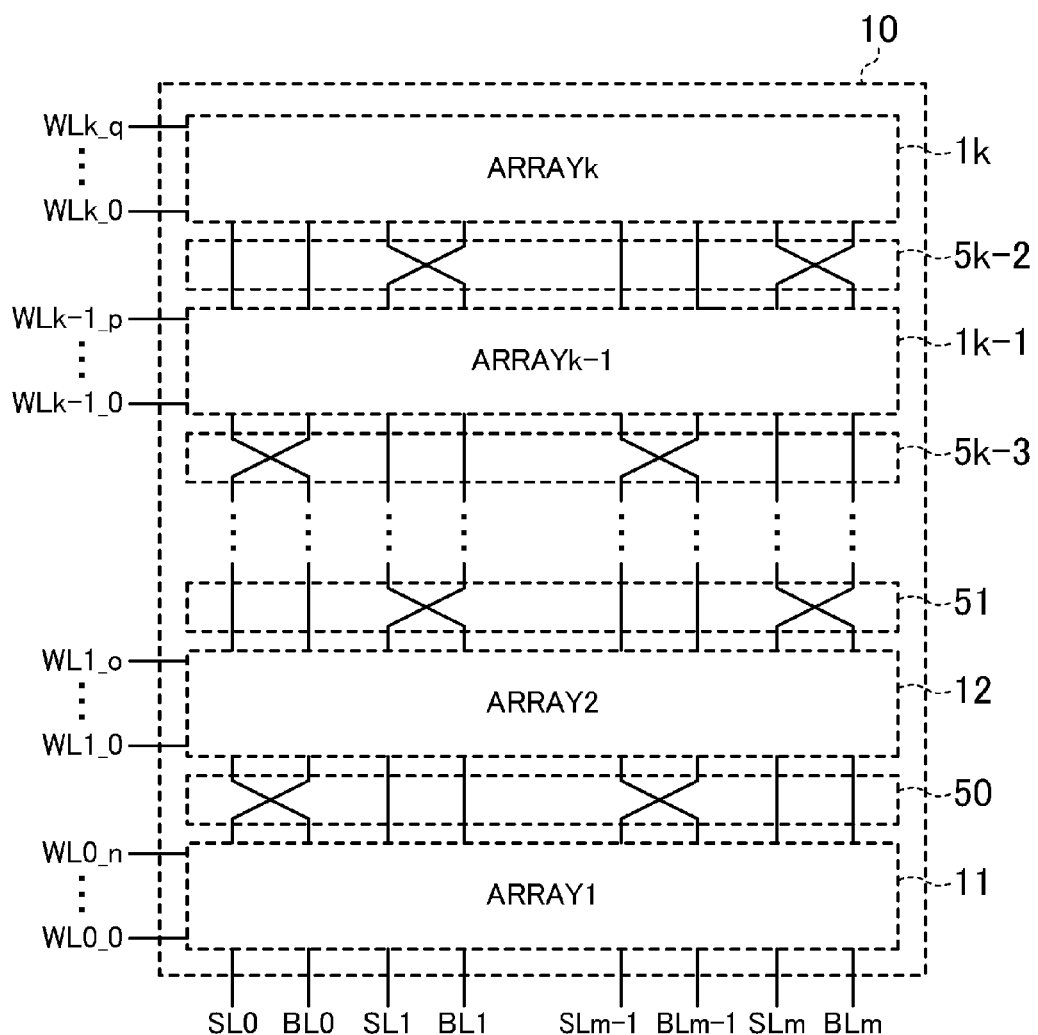
FIG. 12 illustrates still another example configuration of the memory array illustrated in FIG. 1.

FIG. 12 illustrates still another example configuration of the memory array illustrated in FIG. 1. As illustrated in FIG. 12, in the intersection regions 50 to 5k-2 of the memory array 10, some pairs of the bit lines BL0 to BLm and the source lines SL0 to SLm are cross-connected to each other, and the pairs of the bit lines BL and the source lines SL cross-connected to each other may differ among the intersection regions 50 to 5k-2. Regarding the other pairs of the bit lines BL and the source lines SL that are not cross-connected to each other, the intersection regions 50 to 5k-2 may be configured such that the bit lines BL are connected to each other and the source lines SL are connected to each other.

In this manner, the bit lines BL and the source lines SL that are cross-connected to each other may be efficiently laid out, thereby reducing the layout area necessary for cross connection.

The foregoing description is directed to the embodiment of the present invention. However, a nonvolatile semiconductor memory device according to the present invention is not limited to the above example, and various modifications may be made within the scope of the invention. For example, although the nonvolatile semiconductor memory device of the above embodiment is an example of a resistive random access memory (ReRAM), the present invention is also applicable to nonvolatile semiconductor memory devices such as a magnetoresistive random access memory (MRAM), a phase change random access memory (PRAM), and a ferroelectric random access memory (FeRAM).

In the above-described memory array 10, the bit lines BL and the source lines SL do not necessarily extend in the column direction, and may extend in the row direction.

INDUSTRIAL APPLICABILITY

A nonvolatile semiconductor memory device according to the present invention can uniformize loads due to wiring and vias between the bit lines and the source lines. Thus, the voltage can be well balanced between the case of setting a variable resistance element in a high resistance state and the case of setting the variable resistance element in a low resistance state, thereby enabling a nonvolatile memory to improve its basic characteristics such as a rewriting time characteristic and a data retention characteristic after rewriting. In addition, a parasitic capacitance load in reading and writing data can be reduced to substantially a half, thereby enabling an increase in the speed of reading and writing data. That is, a nonvolatile memory that can be used for increasing the guaranteed number of rewritings, the period of data retention, and the speed of data access, and is useful for, for example, variable resistance nonvolatile semiconductor memory devices.

DESCRIPTION OF REFERENCE CHARACTERS 11 memory cell array (first memory cell array region)
12 memory cell array (second memory cell array region)
22a first switching transistor
22b second switching transistor
22c third switching transistor
22d fourth switching transistor
23 sense amplifier
24 write driver
50 to 5k-2 intersection region
MC0 first memory cell
MC1 second memory cell
RR0 first variable resistance element
RR1 second variable resistance element
TC0 first cell transistor
TC1 second cell transistor
WL0_0 to WL0_n first word line
WL1_0 to WL1_n second word line
BL0 to BLm first data line
SL0 to SLm second data line

The invention claimed is:

1. A nonvolatile semiconductor memory device comprising:
   a plurality of memory cells including at least
   a first memory cell including a first cell transistor and a first variable resistance element having a terminal connected to a drain terminal of the first cell transistor,
   a second memory cell including a second cell transistor and a second variable resistance element having a terminal connected to a drain terminal of the second cell transistor, and
   a third memory cell including a third cell transistor and a third variable resistance element having a terminal connected to a drain terminal of the third cell transistor;
   a plurality of word lines associated with the plurality of memory cells and including
   a first word line connected to a gate terminal of the first cell transistor,
   a second word line connected to a gate terminal of the second cell transistor, and
   a third word line connected to a gate terminal of the third cell transistor and adjacent to the second word line;
   a first data line connecting a source terminal of the first cell transistor to another terminal of the second variable resistance element; and
   a second data line connecting another terminal of the first variable resistance element to a source terminal of the second cell transistor,
   wherein another terminal of the third variable resistance element is connected to the first data line and a source terminal of the third cell transistor is connected to the second data line.

2. A nonvolatile semiconductor memory device comprising:
   a plurality of memory cells arranged in rows and columns and each including a cell transistor and a variable resistance element connected to a drain terminal of the cell transistor;
   a plurality of word lines corresponding to the rows of the plurality of memory cells and each connected in common to gate terminals of the cell transistors included in the corresponding row;
   a plurality of first data lines corresponding to the columns or rows of the plurality of memory cells and each connected in common to the variable resistance elements included in the corresponding column or row;
   a plurality of second data lines corresponding to the columns or rows of the plurality of memory cells and each connected in common to source terminals of the cell transistors included in the corresponding column or row;
   a first memory cell array region including at least one of the plurality of word lines; and
   a second memory cell array region including at least one of the plurality of word lines different from the word line included in the first memory cell array region,
   wherein at least one pair of first and second data lines of the plurality of first and second data lines in the first memory cell array region are connected to at least one pair of first and second data lines of the plurality of first and second data lines in the second memory cell array region.

3. The nonvolatile semiconductor memory device of claim 2, wherein
   the first memory cell array region and the second memory cell array region are adjacent to each other, and
   the first and second memory cell array regions sandwich an intersection region in which the plurality of first data lines in the first memory cell array region are connected to the plurality of second data lines in the second memory cell array region, respectively, and the plurality of second data lines in the first memory cell array region are connected to the plurality of first data lines in the second memory cell array region, respectively.

4. The nonvolatile semiconductor memory device of claim 3, wherein
   the first memory cell array region comprises a plurality of first memory cell array regions,
   the second memory cell array region comprises a plurality of second memory cell array regions respectively adjacent to the plurality of first memory cell array regions, and
   the intersection region comprises a plurality of intersection regions each located between one of the plurality of first memory cell array regions and a corresponding one of the plurality of second memory cell array regions.

5. A nonvolatile semiconductor memory device comprising:
   a plurality of memory cells arranged in rows and columns and each including a cell transistor and a variable resistance element connected to a drain terminal of the cell transistor;
   a plurality of word lines corresponding to the rows of the plurality of memory cells and each connected in common to gate terminals of the cell transistors included in the corresponding row;
   a plurality of first data lines corresponding to the columns or rows of the plurality of memory cells and each connected in common to the variable resistance elements included in the corresponding column or row;
   a plurality of second data lines corresponding to the columns or rows of the plurality of memory cells and each connected in common to source terminals of the cell transistors included in the corresponding column or row;
   a first memory cell array region including at least one of the plurality of word lines; and
   a second memory cell array region including at least one of the plurality of word lines different from the word line included in the first memory cell array region,
   wherein at least one pair of first and second data lines of the plurality of first and second data lines in the first memory cell array region are connected to at least one pair of first and second data lines of the plurality of first and second data lines in the second memory cell array region, and
   at least one pair of first and second data lines of the other first and second data lines in the first memory cell array region are connected to at least one pair of second and first data lines of the other first and second data lines in the second memory cell array region.

6. The nonvolatile semiconductor memory device of claim 5, wherein
   the first memory cell array region and the second memory cell array region are adjacent to each other, and
   the first and second memory cell array regions sandwich an intersection region in which at least one pair of first and second data lines of the plurality of first and second data lines in the first memory cell array region are connected to at least one pair of first and second data lines of the plurality of first and second data lines in the second memory cell array region, and at least one pair of first and second data lines of the other first and second data lines in the first memory cell array region are connected to at least one pair of second and first data lines of the other first and second data lines in the second memory cell array region.

7. The nonvolatile semiconductor memory device of claim 6, wherein
the first memory cell array region comprises a plurality of first memory cell array regions,
the second memory cell array region comprises a plurality of second memory cell array regions respectively adjacent to the plurality of first memory cell array regions, and
the intersection region comprises a plurality of intersection regions each located between one of the plurality of first memory cell array regions and a corresponding one of the plurality of second memory cell array regions.

8. The nonvolatile semiconductor memory device of claim 7, wherein
in each of the plurality of intersection regions, the at least one pair of first and second data lines in the corresponding first memory cell array region is cross-connected to the at least one pair of second and first data lines in the corresponding second memory cell array region,
the plurality of intersection regions include first and second intersection regions, and
the pair of first and second data lines and the pair of second and first data lines that are cross-connected to each other differ between the first and second intersection regions.

9. The nonvolatile semiconductor memory device of claim 1, further comprising:
a sense amplifier that determines data stored in one of the plurality of memory cells;
a first switching transistor that switches connection between the first data line and a ground voltage between on and off;
a second switching transistor that switches connection between the first data line and the sense amplifier between on and off;
a third switching transistor that switches connection between the second data line and the ground voltage between on and off; and
a fourth switching transistor that switches connection between the second data line and the sense amplifier between on and off.

10. The nonvolatile semiconductor memory device of claim 9, wherein
in a mode in which data stored in a selected one of the plurality of memory cells is read out, a voltage is applied to the word line corresponding to the selected memory cell,
in a case where the variable resistance element of the selected memory cell is connected to the first data line, and a source terminal of the cell transistor of the selected memory cell is connected to the second data line,
the second switching transistor and the third switching transistor are activated,
the first data line is connected to the sense amplifier, and the second data line is connected to the ground voltage, and
in a case where the variable resistance element of the selected memory cell is connected to the second data line and a source terminal of the cell transistor of the selected memory cell is connected to the first data line,
the first switching transistor and the fourth switching transistor are activated,
the second data line is connected to the sense amplifier, and
the first data line is connected to the ground voltage.

11. The nonvolatile semiconductor memory device of claim 9, wherein
in a mode in which data stored in a selected one of the plurality of memory cells is read out, a voltage is applied to the word line corresponding to the selected memory cell,
in a case where the variable resistance element of the selected memory cell is connected to the first data line and a source terminal of the cell transistor of the selected memory cell is connected to the second data line,
the first switching transistor and the fourth switching transistor are activated,
the second data line is connected to the sense amplifier, and
the first data line is connected to the ground voltage, and
in a case where the variable resistance element of the selected memory cell is connected to the second data line, and a source terminal of the cell transistor of the selected memory cell is connected to the first data line,
the second switching transistor and the third switching transistor are activated,
the first data line is connected to the sense amplifier, and
the second data line is connected to the ground voltage.

12. The nonvolatile semiconductor memory device of claim 1, further comprising:
a driver that applies a write voltage to one of the plurality of memory cells;
a first switching transistor that switches connection between the first data line and a ground voltage between on and off;
a second switching transistor that switches connection between the first data line and the driver between on and off;
a third switching transistor that switches connection between the second data line and the ground voltage between on and off; and
a fourth switching transistor that switches connection between the second data line and the driver between on and off.

13. The nonvolatile semiconductor memory device of claim 12, wherein
in a mode in which data is stored in a selected one of the plurality of memory cells, a voltage is applied to the word line corresponding to the selected memory cell,
in a case where the variable resistance element of the selected memory cell is connected to the first data line, and a source terminal of the cell transistor of the selected memory cell is connected to the second data line,
the second switching transistor and the third switching transistor are activated,
the first data line is connected to the driver, and
the second data line is connected to the ground voltage, and
in a case where the variable resistance element of the selected memory cell is connected to the second data line, a source terminal of the cell transistor of the selected memory cell is connected to the first data line, the first switching transistor and the fourth switching transistor are activated,
the second data line is connected to the driver, and
the first data line is connected to the ground voltage.

14. The nonvolatile semiconductor memory device of claim 12, wherein
in a mode in which data is stored in a selected one of the plurality of memory cells, a voltage is applied to the word line corresponding to the selected memory cell,
in a case where the variable resistance element of the selected memory cell is connected to the first data line, and a source terminal of the cell transistor of the selected memory cell is connected to the second data line,
the first switching transistor and the fourth switching transistor are activated,
the second data line is connected to the driver, and
the first data line is connected to the ground voltage, and
in a case where the variable resistance element of the selected memory cell is connected to the second data line, a source terminal of the cell transistor of the selected memory cell is connected to the first data line,
the second switching transistor and the third switching transistor are activated,
the first data line is connected to the driver, and
the second data line is connected to the ground voltage.

* * * * *